(12) United States Patent
Song et al.

(10) Patent No.: US 10,770,532 B2
(45) Date of Patent: Sep. 8, 2020

(54) DISPLAY SUBSTRATE AND METHOD FOR PREPARING THE SAME, AND DISPLAY DEVICE

(71) Applicant: BOE Technology Group Co., Ltd., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/515,781

(22) Filed: Jul. 18, 2019

(65) Prior Publication Data

US 2020/0194528 A1 Jun. 18, 2020

(30) Foreign Application Priority Data

Dec. 13, 2018 (CN) .......................... 2018 1 1524811

(51) Int. Cl.
  *H01L 51/56* (2006.01)
  *H01L 51/52* (2006.01)
  *H01L 27/32* (2006.01)

(52) U.S. Cl.
  CPC ...... *H01L 27/3269* (2013.01); *H01L 27/3276* (2013.01); *H01L 51/5206* (2013.01); *H01L 51/5221* (2013.01); *H01L 51/56* (2013.01); *H01L 27/32* (2013.01); *H01L 27/3227* (2013.01); *H01L 51/5253* (2013.01)

(58) Field of Classification Search
  CPC . H01L 27/32; H01L 27/3227; H01L 27/3269; H01L 27/3276; H01L 51/56; H01L 51/5253; H01L 51/5206; H01L 51/5221
  See application file for complete search history.

(56) References Cited

U.S. PATENT DOCUMENTS

2004/0075637 A1* 4/2004 Izumi ................. H04N 1/02805
  345/104
2006/0180890 A1 8/2006 Naugler, Jr. et al.
(Continued)

FOREIGN PATENT DOCUMENTS

| CN | 101047200 A | 10/2007 |
| CN | 106887212 A | 6/2017 |
| CN | 107968110 A | 4/2018 |

OTHER PUBLICATIONS

Office Action of CN Application No. 201811524811.6 and translation, dated Mar. 17, 2020, 16 pages.

*Primary Examiner* — Mohsen Ahmadi
(74) *Attorney, Agent, or Firm* — Muncy, Geissler, Olds & Lowe, PC

(57) ABSTRACT

A display substrate according to an embodiment of the present disclosure comprises a substrate and a plurality of pixel units on the substrate, at least one of the plurality of pixel units comprising a light-emitting unit, a photosensitive unit for detecting light emitted by the light-emitting unit, and an interlayer insulating layer between the photosensitive unit and the light-emitting unit, wherein the interlayer insulating layer comprises a groove, an orthogonal projection of which on the substrate does not coincide with an orthogonal projection of the photosensitive unit on the substrate, and the light-emitting unit covers the groove.

15 Claims, 4 Drawing Sheets

(56) References Cited

U.S. PATENT DOCUMENTS

| | | | |
|---|---|---|---|
| 2007/0236429 A1 | 10/2007 | Tseng et al. | |
| 2010/0311499 A1* | 12/2010 | Tarantino | G07F 17/32 463/27 |
| 2017/0123248 A1* | 5/2017 | Ro | G02F 1/133512 |
| 2017/0146853 A1* | 5/2017 | Lee | G02F 1/134309 |
| 2019/0057657 A1 | 2/2019 | Liu et al. | |
| 2019/0129510 A1* | 5/2019 | Wang | G06F 3/042 |
| 2019/0157629 A1 | 5/2019 | Wang | |
| 2019/0340409 A1* | 11/2019 | Zhu | G06K 9/00006 |
| 2019/0348479 A1* | 11/2019 | Huangfu | H01L 27/3276 |
| 2020/0044004 A1* | 2/2020 | Wang | H01L 51/5234 |
| 2020/0066825 A1* | 2/2020 | Yang | H01L 51/0096 |
| 2020/0098839 A1* | 3/2020 | Xu | G02B 5/22 |

* cited by examiner

DISPLAY SUBSTRATE AND METHOD FOR PREPARING THE SAME, AND DISPLAY DEVICE

CROSS-REFERENCE TO RELATED APPLICATION

This application claims a priority to Chinese Patent Application No. 201811524811.6 filed on Dec. 13, 2018, the disclosures of which are incorporated in their entirety by reference herein.

TECHNICAL FIELD

The present disclosure belongs to the field of display technology, in particular, to a display substrate, a method for preparing the same, and a display device.

BACKGROUND

Currently, the optical compensation scheme for the display panel is to perform one optical compensation on the entire display panel when the display panel leaves factory. The optically compensation to backplane currently developed is to add a photosensor and a control unit to the backplane. Similar to electrical compensation, the change of the luminous efficiency of the light-emitting device can be monitored, thereby compensating for mura.

SUMMARY

An embodiment of the present disclosure provides a display substrate, comprising a substrate and a plurality of pixel units on the substrate, at least one of the plurality of pixel units comprising a light-emitting unit, a photosensitive unit for detecting light emitted by the light-emitting unit, and an interlayer insulating layer between the photosensitive unit and the light-emitting unit, wherein the interlayer insulating layer comprises a groove, an orthogonal projection of which on the substrate does not coincide with an orthogonal projection of the photosensitive unit on the substrate, and the light-emitting unit covers the groove.

Optionally, the photosensitive unit comprises a photodiode.

Optionally, the photodiode comprises an N-type doped semiconductor layer and a P-type doped semiconductor layer sequentially arranged on the substrate, wherein the P-type doped semiconductor layer is electrically connected to a reverse bias voltage signal line; a side of the photodiode proximate to the reverse bias voltage signal line connected by the P-type doped semiconductor layer is a connection side; and a contour of the orthogonal projection of the groove on the substrate is adjacent to a contour of an orthogonal projection of a portion of the photosensitive unit other than the connection side on the substrate.

Optionally, the display substrate further comprises a plurality of scanning lines, a plurality of reverse bias voltage signal lines and a plurality of signal reading lines, the plurality of scanning lines and the plurality of reverse bias voltage signal lines crossing to define the plurality of pixel units, and each of the pixel units is further provided with a switching transistor and a capacitor, wherein controls electrode of the switching transistors located in a same row are connected to a same scanning line, first electrodes of the switching transistors located in a same column are connected to a same signal reading line, second electrodes of the switching transistor in each of the pixel units are connected to the N-type doped semiconductor layer of the photodiode, P-type doped semiconductor layers of the photodiodes located in a same column are connected to a same reverse voltage signal line, and the capacitor is connected between an N-type doped semiconductor layer and a P-type doped semiconductor layer of a photodiode in the pixel units.

Optionally, the light-emitting unit comprises an organic light-emitting device comprising a first electrode, a light-emitting layer and a second electrode sequentially arranged on the substrate.

Optionally, a first connection electrode is arranged on a side of the N-type doped semiconductor layer proximate to the substrate and configured to electrically connect the N-type doped semiconductor layer and the switching transistor; and a second connection electrode is arranged on a side of the P-type doped semiconductor layer away from the substrate and configured to connect the P-type doped semiconductor layer and the reverse bias voltage signal line.

Optionally, the first connection electrode and the first electrode and the second electrode of the switching transistor are made of a same material and arranged in a same layer; and a material of the second connection electrode is a transparent conductive material.

Optionally, a material of the first electrode comprises indium tin oxide or zinc oxide; and a material of the second electrode comprises any one of lithium, magnesium, calcium, strontium, aluminum, indium, and an alloy of the above materials with copper, gold or silver.

Optionally, a material of the interlayer insulating layer comprises any one of polysiloxane, acrylic and polyimide.

An embodiment of the present disclosure provides a method for preparing a display substrate, comprising: forming a plurality of pixel units, which comprises forming a photosensitive unit, an interlayer insulating layer and a light-emitting unit on a substrate; and further comprising: before the forming the light-emitting unit, forming a groove in the interlayer insulating layer, wherein an orthogonal projection of the groove on the substrate does not coincide with an orthogonal projection of the photosensitive unit on the substrate, and the light-emitting unit is configured to covers the groove.

Optionally, the photosensitive unit comprises a photodiode comprising an N-type doped semiconductor layer and a P-type doped semiconductor layer sequentially arranged on the substrate; wherein the P-type doped semiconductor layer is electrically connected to a reverse bias voltage signal line; a side of the photodiode proximate to the reverse bias voltage signal line connected by the P-type doped semiconductor layer is a connection side; and a contour of the orthogonal projection of the groove on the substrate is adjacent to a contour of an orthogonal projection of a portion of the photosensitive unit other than the connection side on the substrate.

Optionally, the method further comprises: forming a switching transistor, scanning lines and reverse bias voltage signal lines crossing each other, signal reading lines, and a first connection electrode for electrically connecting the N-type doped semiconductor layer and the switching transistor on the substrate before the forming the photosensitive unit.

Optionally, the light-emitting unit comprises an organic light-emitting device comprising a first electrode, a light-emitting layer and a second electrode sequentially arranged on the substrate. The forming the plurality of pixel units comprises: on the substrate formed with the first connection electrode, forming a pattern comprising a photodiode and a second connection electrode by one patterning process;

forming an interlayer insulating layer, and etching a groove in the interlayer insulating layer; and forming a pattern of the first electrode comprised in the organic light-emitting device by a patterning process, such that the first electrode covers the groove; forming a pixel definition layer; forming a light-emitting layer to cover the first electrode and the pixel definition layer; and forming a pattern of the second electrode comprised in the organic light-emitting device by a patterning process, such that the second electrode covers the light-emitting layer.

An embodiment of the present disclosure provides a display device comprising the display substrate as described above.

Figure 1:
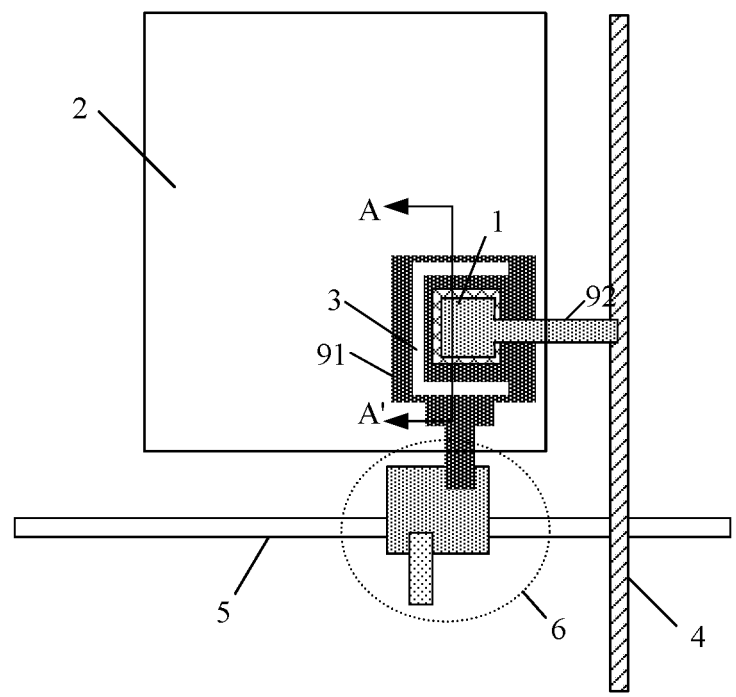
FIG. 1 is a top view of an display substrate according to some embodiments of the present disclosure.

Among them, the reference numerals are: 1, photosensitive unit; 10, substrate; 11, N-type doped semiconductor layer; 12, intrinsic semiconductor layer; 13, P-type doped semiconductor layer; 2, light-emitting unit; 21, first electrode; 22, light-emitting layer; 23, second electrode; 3, groove; 4, reverse bias voltage signal line; 5, scanning line; 6, switching transistor; 7, interlayer insulating layer; 71, passivation layer; 72, planarization layer; 8, pixel definition layer; 91, first connection electrode; 92, second connection electrode; C0, capacitor; 14, signal reading line; 20, pixel unit.

DETAILED DESCRIPTION

In order to allow one skilled in the art to better understand the technical solutions of the present disclosure, the present disclosure will be further described below in detail in conjunction with the drawings and detailed description.

The inventors have found that in a display device using an optical compensation method, since the light emitted by each of the light-emitting devices in the display device is divergent, the photosensitive device is capable of not only receiving the light emitted by the corresponding light-emitting device, but also of receiving the light emitted by other light-emitting devices, thereby causing an inaccurate detection of the luminous efficiency of the light-emitting device, and further resulting in inaccurate optical compensation of the display panel.

Figure 2:
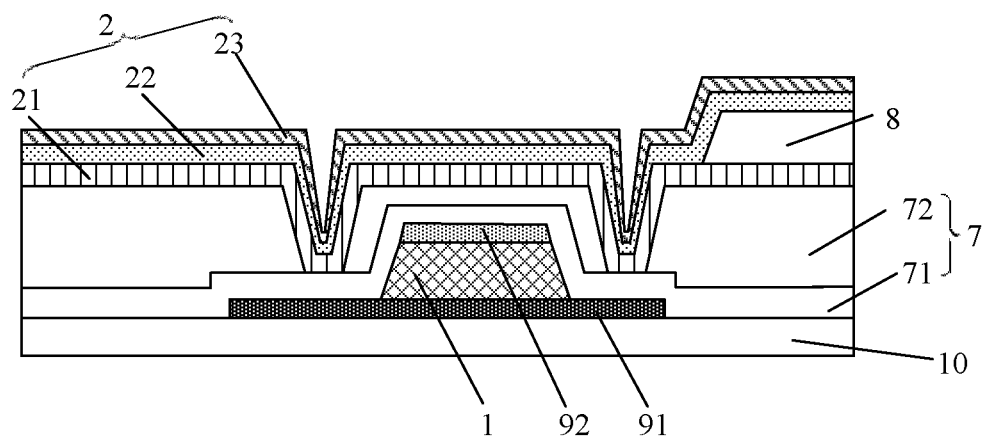
FIG. 2 is a cross-sectional view taken along line A-A' of FIG. 1.

As shown in FIGS. 1 and 2, some embodiments of the present disclosure provide a display substrate comprising a substrate 10 and a plurality of pixel units on the substrate 10, in which each of the plurality of pixel units comprises a photosensitive layer 1, an interlayer insulating layer 7 and a light-emitting unit 2 sequentially arranged on the substrate 10, and the photosensitive unit 1 is arranged corresponding to the light-emitting unit 2 to detect the light emitted by the light-emitting unit 2. In the display substrate of some embodiments of the present disclosure, a groove 3 is provided in the interlayer insulating layer 7, the orthogonal projection of the groove 3 on the substrate 10 does not coincide with the orthogonal projection of the photosensitive unit 1 on the substrate 10, and the light-emitting unit 2 covers the groove 3. In this way, at least a portion of the side surface of the photosensitive unit 1 is arranged opposite to the side wall of the groove 3.

It can be understood that the light-emitting unit is a bottom emission type light-emitting unit, that is, the light-emitting side of the light-emitting unit faces the photosensitive unit, and the photosensitive unit is closer to the substrate 10 than the light-emitting unit and can receive the light emitted by the light-emitting unit.

In the display substrate of some embodiments of the present disclosure, since a groove 3 is provided in at least a portion of the interlayer insulating layer 7 corresponding the peripheral contour of the photosensitive layer and the light-emitting unit 2 covers the groove 3, a portion of the light-emitting unit 2 located in the groove 3 can be arranged opposite to the side wall of the photosensitive unit 1. Further, since the light-emitting unit 2 is a bottom emission type light-emitting element and the second electrode 23 of the light-emitting unit 2 away from the substrate 10 is a reflective electrode, the reflective electrode of the light-emitting unit 2 arranged opposite to the side wall of the photosensitive unit 1 may reflect the light incident from other light-emitting units to the pixel unit, thereby avoiding the light interference between adjacent pixel units, and further effectively avoiding the problem that the photosensitive unit 1 does not accurately detect the luminous efficiency of the corresponding light-emitting unit 2.

In some embodiments of the present disclosure, the specific structure of the display substrate is described by taking the photosensitive unit 1 as a PIN type photodiode and the light-emitting unit 2 as an organic light-emitting device in each of the plurality of pixel units as an example. It can be understood that the photosensitive unit 1 may also be other types of photosensitive elements such as PN type photodiodes.

Figure 4:
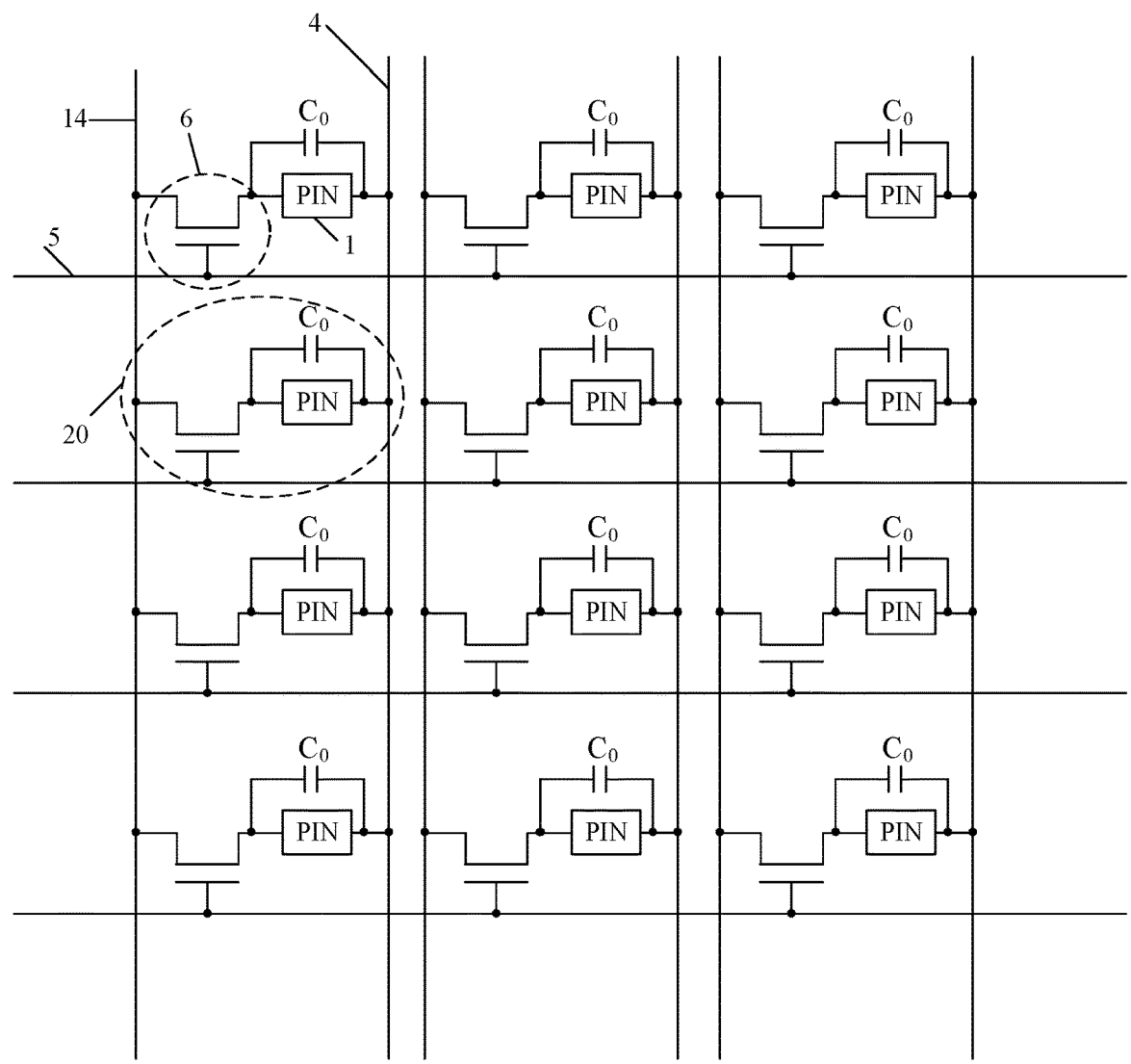
FIG. 4 is a schematic view showing the arrangement of pixel units in a display substrate according to some embodiments of the present disclosure.

As shown in FIGS. 1, 2 and 4, the display substrate comprises a plurality of scanning lines 5, a plurality of reverse bias voltage signal lines 4 and a plurality of signal reading lines 14, the plurality of scanning lines 5 and the plurality of reverse bias voltage signal lines 4 cross to define a plurality of pixel units 20, and the signal reading line 14 may be arranged in parallel with the reverse bias voltage signal line 4 to reduce wiring space and to increase pixel aperture ratio.

In some embodiments of the present disclosure, each of the plurality of pixel units comprises a switching transistor 6, a photodiode 1, an interlayer insulating layer 7, and an organic light-emitting device 2 sequentially arranged on a substrate 10.

Figure 3:
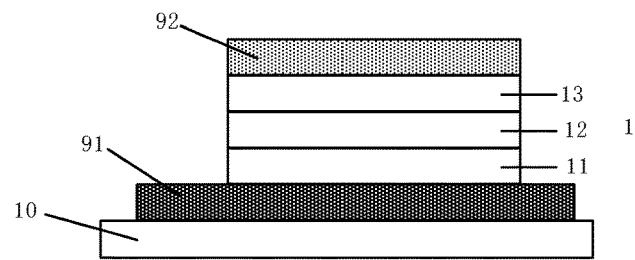
FIG. 3 is a schematic view showing a structure of a photodiode connected with a first connection electrode and a second connection electrode according to some embodiments of the present disclosure.

As shown in FIG. 3, the photodiode 1 comprises an N-type doped semiconductor layer 11, an intrinsic semiconductor layer 12, and a P-type doped semiconductor layer 13 sequentially arranged on a substrate 10, wherein a first connection electrode 91 is arranged on a side of the N-type doped semiconductor layer 11 proximate to the substrate 10, and the first connection electrode 91 and the first electrode and the second electrode of the switching transistor 6 may be made of the same material and arranged in the same layer, which simplifies the preparation process and is capable of electrically connecting the N-type doped semiconductor layer 11 to the switching transistor 6; and a second connection electrode 92 is arranged on a side of the P-type doped semiconductor layer 13 away from the substrate 10 and configured to connect the P-type doped semiconductor layer 13 and the reverse bias voltage signal line 4. The material of the second connection electrode 92 is a transparent conductive material, to ensure that light can be irradiated onto the photodiode 1.

As shown in FIG. 4, control electrodes of the switching transistor 6 located in a same row of the pixel units are connected to a same scanning line 5; first electrodes of the switching transistor 6 in a same column of the pixel units are connected to a same signal reading line 14; second electrodes of the switching transistor 6 in each of the plurality of pixel units are connected to the N-type doped semiconductor layer 11 of the photodiode 1; and P-type doped semiconductor layers 13 of the photodiode 1 located in a same column of the pixel units are connected to a same reverse voltage signal line 4. In this way, the pixel units in a same row can be controlled by a same scanning line 5, and the optical signals sensed by the photodiodes 1 in a same column of the pixel units can be output by a same signal reading line 14, thereby facilitating the driving of the pixel units and simplifying the wiring of the display substrate.

In some embodiments, a side of the photodiode 1 proximate to the reverse bias voltage signal line 4 connected by the P-type doped semiconductor layer 13 in each of the plurality of pixel units is a connection side, and the groove 3 provided in the interlayer insulating layer 7 is arranged around at least one side of the photodiode 1 other than its connection side. That is, a contour of the orthogonal projection of the groove 3 on the substrate 10 is adjacent to a contour of an orthogonal projection of a portion of the photosensitive unit 1 other than the connection side on the substrate 10. The organic light-emitting device 2 is formed on the interlayer insulating layer 7 and covers the groove 3, such that the photodiode 1 can receive the light emitted by the organic light-emitting device 2 from both the top surface and the side surface, thereby improving the detection accuracy for photodiode 1. In this arrangement, the area occupied by the photodiode 1 can be appropriately reduced to increase the aperture ratio of the pixel unit, and a structure in which the organic light-emitting device 2 in the groove surrounds the photodiode 1 can be formed so that the noise interference generated when adjacent sub-pixel units emit light can be reduced by the structure.

Figure 5:
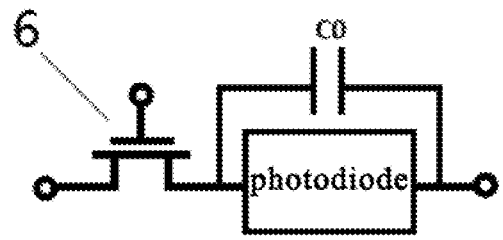
FIG. 5 is a schematic view of one pixel unit of FIG. 4.

Of course, as shown in FIGS. 4 and 5, a capacitor C0 is also arranged in each pixel unit and connected between the N-type doped semiconductor layer 11 and the P-type doped semiconductor layer 13 of the photodiode 1. When the organic light-emitting device 2 emits light, a reverse photocurrent is accumulated on the capacitor C0. After the photosensitive detection phase is completed, the switching transistor 6 is turned on to supply the reverse photocurrent accumulated on the capacitor C0 to the peripheral circuit. Thereafter, the voltage to be compensated when the organic light-emitting device 2 emits light is calculated by the reverse photocurrent.

The organic light-emitting device 2 comprises a first electrode 21, a light-emitting layer 22 and a second electrode 23 sequentially arranged on the substrate 10, the first electrode 21 may be a transparent electrode, the second electrode may be a reflective electrode. One of the first electrode 21 and the second electrode 23 serves as an anode of the organic light-emitting device 2, and the other serves as a cathode. In some embodiments of the present disclosure, the first electrode 21 is an anode and the second electrode 23 is a cathode. The anode is usually made of an inorganic metal oxide (such as indium tin oxide(ITO), zinc oxide(ZnO), etc.), organic conductive polymers (e.g., poly(3,4-ethylene-dioxythiophene)/poly(styrenesulfonate) (PEDOT: PSS), polyaniline (PAM), etc.) or a metal material having a high work function (e.g., gold, copper, silver, platinum, etc.). The cathode is usually made of a metal material having a low work function (e.g., lithium, magnesium, calcium, strontium, aluminum, indium, etc., or an alloy of the above metal with copper, gold or silver), or made of a very thin buffer insulating layer (such as lithium fluoride(LiF), cesium carbonate($CsCO_3$), etc.) and the above metals or alloys.

Among them, the material of the interlayer insulating layer 7 in some embodiments of the present disclosure comprises any one or more of polysiloxane, acrylic and polyimide, of course, as long as any one or more of polysiloxane, acrylic and polyimide may be used.

Some embodiments of the present disclosure provide a method for preparing a display substrate, which can be used for preparing a display substrate in the embodiment. The method comprises forming a plurality of pixel units on the substrate 10. The forming the plurality of pixel units comprises forming a photosensitive unit 1, an interlayer insulating layer 7 and a light-emitting unit 2 on the substrate 10. The photosensitive unit 1 corresponds to the light-emitting unit 2 for detecting light emitted by the light-emitting unit 2. Before the forming the light-emitting unit 2, the method further comprises forming a groove 3 in the interlayer insulating layer 7, the orthogonal projection of the groove 3 on the substrate 10 does not coincide with the orthogonal projection of photosensitive unit 1 on the substrate 10, and the light-emitting unit 2 covers the grooves 3. In this way, at least a portion of the outer contour of the photosensitive unit 1 is adjacent to the groove 3.

In the display substrate of some embodiments of the present disclosure, since the groove 3 is formed in at least a portion of the interlayer insulating layer 7 corresponding the peripheral contour of the photosensitive unit 1 and the light-emitting unit 2 covers the groove 3, a portion of the light-emitting unit 2 covering the groove 3 can surround the peripheral contour of the adjacent photosensitive unit 1. Meanwhile, since the light-emitting unit 2 is a bottom emission type light-emitting unit and the electrode of the light-emitting unit 2 away from the substrate 10 is a reflective electrode, the light irradiated to the side of the photosensitive unit 1 in the pixel units by the light-emitting unit in the other pixel unit can be reflected back, to avoid the light interference from other pixel units, thereby effectively avoiding the problem that the photosensitive unit does not accurately detect the luminous efficiency of the corresponding light-emitting unit.

In some embodiments of the present disclosure, the method for preparing the display substrate in some embodiments of the present disclosure is specifically described by taking the photosensitive unit as a photodiode and the light-emitting unit as an organic light-emitting device in each of the plurality of pixel units. In order to more clearly show the structure of each layer in the substrate, only one pixel unit, as an example, is formed in the description of the following method.

On the substrate, a switching transistor is formed, and scanning lines and reverse bias voltage signal lines crossing each other, signal reading lines, and a first connection electrode of the photodiode are formed at the same time.

In some embodiments, a switching transistor is taken as a bottom gate type transistor as an example. First, a pattern comprising a gate electrode (control electrode) of a switching transistor and a scanning line is formed by a patterning process, and the gate electrode and the scanning line are connected. A gate insulating layer is formed. A pattern comprising an active layer of the switching transistor is formed by a patterning process. A pattern comprising a source electrode (a first electrode of the switching transistor) and a drain electrode (a second electrode of the switching transistor) of the switching transistor as well as a reverse bias voltage signal line, a signal reading line and a first connection electrode is formed by a patterning process.

Figure 6:
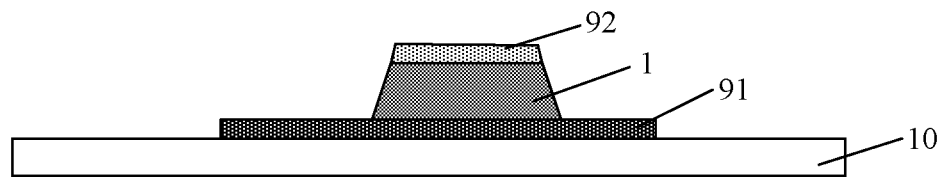
FIG. 6 is a schematic view showing a structure of a photodiode formed by a method for preparing a display substrate according to some embodiments of the present disclosure.

As shown in FIG. 6, on the substrate 10 formed with the first connection electrode 91, a pattern comprising a photodiode 1 and a second connection electrode 92 is formed by one patterning process.

Specifically, an N-type doped semiconductor material layer, an intrinsic semiconductor material layer, a P-type doped semiconductor material layer and a transparent conductor material layer of the photodiode 1 are sequentially deposited on the substrate 10 formed with the first connection electrode 91. A pattern comprising the N-type doped semiconductor layer 11, the intrinsic semiconductor layer 12, the P-type doped semiconductor layer 13 and the second connection electrode 92 of the photodiode 1 is formed by one patterning process, in which the N-type doped semiconductor layer 11 of the photodiode 1 is connected to the drain electrode of the switching transistor 6. The N-type doped semiconductor layer 11 is a phosphorus doped or arsenic doped semiconductor layer, and the P-type doped semiconductor layer 13 is a boron doped semiconductor layer.

Figure 7:
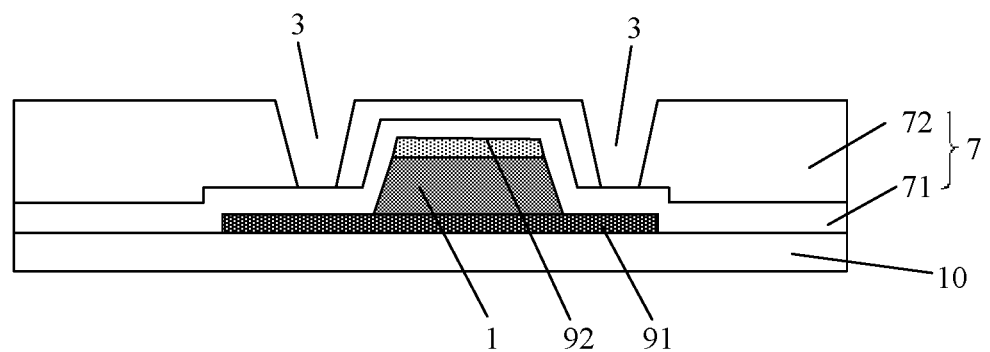
FIG. 7 is a schematic view showing a structure of a groove formed by a method for preparing a display substrate according to some embodiments of the present disclosure.

As shown in FIG. 7, an interlayer insulating layer 7 is formed, a groove 3 is formed in the interlayer insulating layer 7, and a side of the photodiode 1 proximate to the reverse bias voltage signal line 4 connected by the P-type doped semiconductor layer 13 is a connection side. The groove 3 surrounds the respective sides (the other three sides) of the photodiode 1 other than its connection side.

Specifically, on the substrate on which the operation as shown in FIG. 6 is performed, a passivation layer 71 and an planarization layer 72 are formed. Then, the planarization layer 72 is etched to form the groove 3. The groove 3 surrounds the respective sides of the photodiode 1 other than its connection side, that is, a contour of the orthogonal projection of the groove 3 on the substrate 10 is adjacent to a contour of the orthogonal projection of the portion of the photodiode 1 other than the connection side. The material of the planarization layer 72 comprises any one of polysiloxane, acrylic and polyimide, of course, as long as any one of polysiloxane, acrylic, and polyimide may be used.

Figure 8:
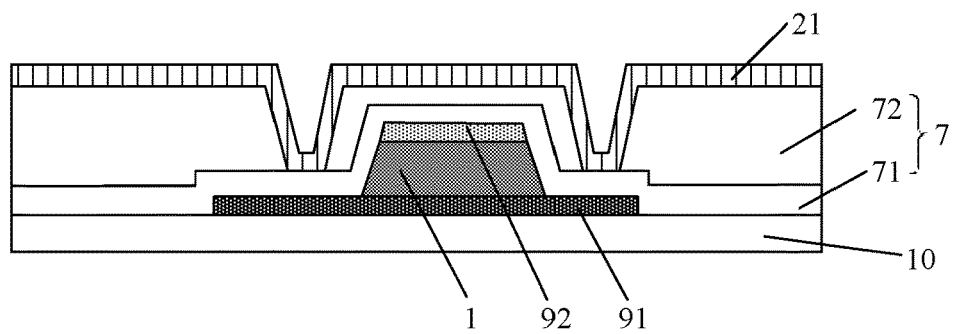
FIG. 8 is a schematic view showing a structure of a first electrode of an organic light-emitting device formed by a method for preparing a display substrate according to some embodiments of the present disclosure.

As shown in FIG. 8, a pattern of the first electrode 21 comprised in the organic light-emitting device 2 is formed by a patterning process, and the first electrode 21 covers the groove 3.

Specifically, the first electrode 21 formed may be an anode of the organic light-emitting device 2, and the anode serves as a connection layer of the forward voltage of the organic light-emitting device 2 and has good electrical conductivity and a high work function. Optionally, the first electrode 21 has visible light transmission. The anode is usually made of an inorganic metal oxide (such as indium tin oxide(ITO), zinc oxide(ZnO), etc.), organic conductive polymers (e.g., poly(3,4-ethylenedioxythiophene)/poly(styrenesulfonate) (PEDOT: PSS), polyaniline (PANI), etc.) or a metal material having a high work function (e.g., gold, copper, silver, platinum, etc.).

Figure 9:
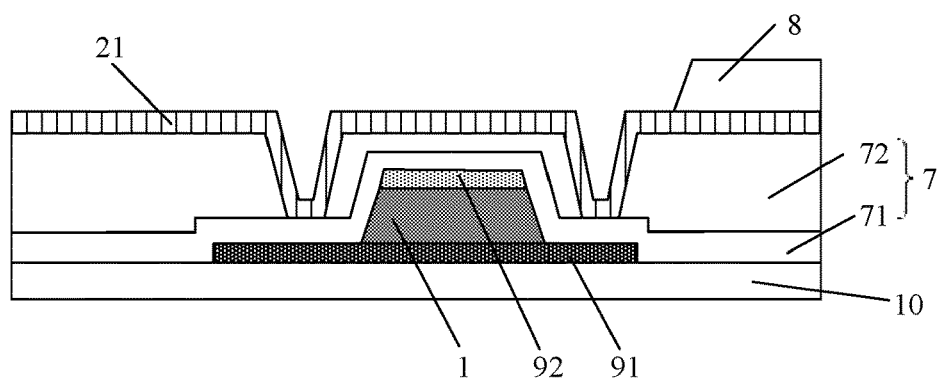
FIG. 9 is a schematic view showing a structure of a light-emitting layer of an organic light-emitting device formed by a method for preparing a display substrate according to some embodiments of the present disclosure.

As shown in FIG. 9, a pixel definition layer 8 is formed.

Figure 10:
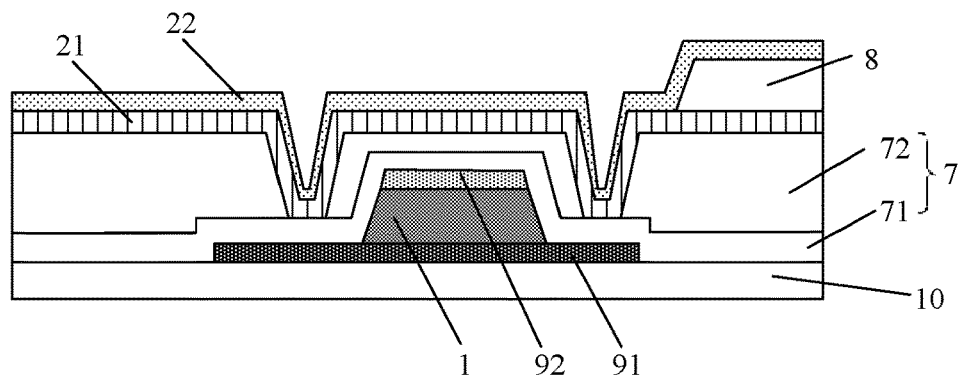
FIG. 10 is a schematic view showing a structure of a second electrode of an organic light-emitting device formed by a method for preparing a display substrate according to some embodiments of the present disclosure.

As shown in FIG. 10, the light-emitting layer 22 is formed to cover the first electrode 21 and the pixel definition layer 8.

A hole injecting layer and a hole transport layer may be formed between the light-emitting layer 22 and the first electrode 21, and an electron transport layer and an electron injecting layer may be formed on the light-emitting layer 22.

As shown in FIG. 2, a pattern of the first electrode 23 comprised in the organic light-emitting device 2 is formed by a patterning process, and the first electrode 23 covers the light-emitting layer 22.

The second electrode 23 may be a cathode of the organic light-emitting device 2, and the cathode serves as a connection layer of the negative voltage of the organic light-emitting device and has better electrical conductivity and a lower work function. The cathode is usually made of a metal material having a low work function, e.g., lithium, magnesium, calcium, strontium, aluminum, indium or the like, or an alloy of the above metal with copper, gold or silver; or made of a very thin buffer insulating layer (such as lithium fluoride(LiF), cesium carbonate($CsCO_3$), etc.) and the above metals or alloys.

At this point, the preparation of the display substrate in some embodiments of the present disclosure is completed.

Some embodiments of the present disclosure provide a display device comprising the display substrate as described in the above embodiments.

The display device may be an OLED display device, e.g., a mobile phone, a tablet computer, a television, a display, a notebook computer, a digital photo frame, a navigator, or any product or component having a display function.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. Similarly, the words "one", "a/an" and the like do not denote any quantitative limitation, but rather denote at least one. The "comprising", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may comprise electrical connections, whether direct or indirect. "On", "under", "left", "right" and the like are only used to represent relative positional relationships, and when the absolute position of the described object is changed, the relative positional relationship may also be changed, accordingly.

When an element, such as a layer, film, region, or substrate, is referred to as being "on" or "under" another element, the element may be directly "on" or "under" another element, or there may be an intermediate element.

It is to be understood that the above embodiments are merely exemplary embodiments to explain the principles of the present disclosure, but the present disclosure is not limited thereto. One skilled in the art would make various modifications and improvements without departing from the spirit and scope of the present disclosure. These modifications and improvements should also be regarded as the protection scope of the present disclosure.

What is claimed is:

1. A display substrate, comprising a substrate and a plurality of pixel units on the substrate, at least one of the plurality of pixel units comprising a light-emitting unit, a photosensitive unit for detecting light emitted by the light-emitting unit, and an interlayer insulating layer between the photosensitive unit and the light-emitting unit,
    wherein the interlayer insulating layer comprises a groove, an orthogonal projection of the groove on the substrate does not coincide with an orthogonal projection of the photosensitive unit on the substrate, and the light-emitting unit covers the groove;
    wherein the photosensitive unit comprises a photodiode;
    wherein the photodiode comprises an N-type doped semiconductor layer and a P-type doped semiconductor layer sequentially arranged on the substrate; wherein
    the P-type doped semiconductor layer is electrically connected to a reverse bias voltage signal line;
    a side of the photodiode proximate to the reverse bias voltage signal line connected to the P-type doped semiconductor layer is a connection side; and a contour of the orthogonal projection of the groove on the substrate is adjacent to a contour of an orthogonal projection of a portion of the photodiode other than the connection side on the substrate, and
    a plurality of scanning lines, a plurality of reverse bias voltage signal lines and a plurality of signal reading lines, the plurality of scanning lines and the plurality of reverse bias voltage signal lines crossing to define the plurality of pixel units, and each of the plurality of pixel units further comprising a switching transistor; wherein
    control electrodes of the switching transistors located in a same row are connected to a same scanning line; first electrodes of the switching transistors located in a same column are connected to a same signal reading line; second electrodes of the switching transistor in each of the pixel units are connected to the N-type doped semiconductor layer of the photodiode; and
    the P-type doped semiconductor layer of the photodiode located in a same column are connected to a same reverse bias voltage signal line.

2. The display substrate of claim 1, wherein a first connection electrode is arranged on a side of the N-type doped semiconductor layer proximate to the substrate and configured to electrically connect the N-type doped semiconductor layer and the switching transistor; and a second connection electrode is arranged on a side of the P-type doped semiconductor layer away from the substrate and configured to connect the P-type doped semiconductor layer and the reverse bias voltage signal line.

3. The display substrate of claim 2, wherein the first connection electrode and the first electrode and the second electrode of the switching transistor are made of a same material and arranged in a same layer; and a material of the second connection electrode is a transparent conductive material.

4. The display substrate of claim 1, wherein at least one of the plurality of pixel units further comprises a capacitor connected between an N-type doped semiconductor layer and a P-type doped semiconductor layer of a photodiode in the at least one of the plurality of pixel units.

5. The display substrate of claim 1, wherein the light-emitting unit comprises an organic light-emitting device.

6. The display substrate of claim 5, wherein the organic light-emitting device comprises a first electrode, a light-emitting layer and a second electrode sequentially arranged on the substrate.

7. The display substrate of claim 6, wherein
    the first electrode is made of an inorganic metal oxide, an organic conductive polymer or a metal material having a high work function; and
    the second electrode is made of a metal material having a low work function, or made of a very thin buffer insulating layer and the above metals or alloys.

8. The display substrate of claim 7, wherein the inorganic metal oxide comprises any one of indium tin oxide and zinc oxide; the organic conductive polymer comprises any one of poly(3,4-ethylenedioxythiophene)/poly(styrenesulfonate) and polyaniline; and the metal material having a high work function comprises any one of gold, copper, silver, and platinum; and
    the metal material having a low work function comprises any one of lithium, magnesium, calcium, strontium, aluminum, indium, and an alloy of the above materials with copper, gold or silver, and the buffer insulating layer is made of lithium fluoride(LiF) or strontium carbonate($CsCO_3$).

9. A display device, comprising the display substrate of claim 1.

10. The display device of claim 9, wherein the display device is a mobile phone, a tablet computer, a television, a display, a notebook computer, a digital photo frame or a navigator.

11. A method for preparing a display substrate, comprising:
    forming a plurality of pixel units, which comprises forming a photosensitive unit, an interlayer insulating layer and a light-emitting unit on a substrate;
    forming a groove in the interlayer insulating layer before the forming the light-emitting unit, wherein an orthogonal projection of the groove on the substrate does not coincide with the orthogonal projection of the photosensitive unit on the substrate, the light-emitting unit is configured to cover the groove;
    wherein the photosensitive unit comprises a photodiode comprising an N-type doped semiconductor layer and a P-type doped semiconductor layer sequentially arranged on the substrate;
    wherein the P-type doped semiconductor layer is electrically connected to a reverse bias voltage signal line;
    a side of the photodiode proximate to the reverse bias voltage signal line connected by the P-type doped semiconductor layer is a connection side;
    a contour of the orthogonal projection of the groove on the substrate is adjacent to a contour of an orthogonal projection of a portion of the photodiode other than the connection side on the substrate; and
    forming a switching transistor, scanning lines and reverse bias voltage signal lines crossing each othering each other, signal reading lines, and a first connection electrode for electrically connecting the N-type doped semiconductor layer and the switching transistor on the substrate before the forming the photodiode.

12. The method of claim 11, wherein the light-emitting unit comprises an organic light-emitting device comprising a first electrode, a light-emitting layer and a second electrode sequentially arranged on the substrate.

13. The method of claim 12, wherein the forming the plurality of pixel units further comprises forming a pixel definition layer.

14. The method of claim 13, wherein
the forming the photosensitive unit on the substrate comprises: on the substrate with the first connection electrode formed thereof, forming a pattern comprising a photodiode and a second connection electrode by one patterning process; and
the forming the light-emitting unit comprises: forming a pattern of the first electrode comprised in the organic light-emitting device by a patterning process, such that the first electrode covers the groove; forming a light-emitting layer to cover the first electrode and the pixel definition layer; and forming a pattern of the second electrode comprised in the organic light-emitting device by a patterning process, such that the second electrode covers the light-emitting layer.

15. The method substrate of claim 14,
the first electrode is made of an inorganic metal oxide, an organic conductive polymer or a metal material having a high work function; and
the second electrode is made of a metal material having a low work function, or made of a very thin buffer insulating layer and the above metals or alloys.

* * * * *